United States Patent
D'Evelyn

(10) Patent No.: US 8,303,710 B2
(45) Date of Patent: *Nov. 6, 2012

(54) HIGH PRESSURE APPARATUS AND METHOD FOR NITRIDE CRYSTAL GROWTH

(75) Inventor: Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 405 days.

This patent is subject to a terminal disclaimer.

(21) Appl. No.: 12/478,736

(22) Filed: Jun. 4, 2009

(65) Prior Publication Data

US 2009/0320744 A1 Dec. 31, 2009

Related U.S. Application Data

(60) Provisional application No. 61/073,687, filed on Jun. 18, 2008.

(51) Int. Cl.
| | |
|---|---|
| C30B 11/00 | (2006.01) |
| C30B 9/00 | (2006.01) |
| C30B 17/00 | (2006.01) |
| C30B 21/02 | (2006.01) |
| C30B 28/06 | (2006.01) |
| C30B 35/00 | (2006.01) |

(52) U.S. Cl. ............... 117/81; 117/11; 117/73; 117/200
(58) Field of Classification Search .................... 117/11, 117/73, 81, 200
See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,430,051 A | 2/1984 | von Platen | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn et al. | |
| 6,350,191 B1 | 2/2002 | D'Evelyn et al. | |

(Continued)

FOREIGN PATENT DOCUMENTS

JP 2005-289797 A2 10/2005

(Continued)

OTHER PUBLICATIONS

Byrappa et al., "Handbook of Hydrothermal Technology: A Technology for Crystal Growth and Materials Processing," Noyes Publications, Park Ridge, New Jersey, 2001, pp. 94-96 and 152.

(Continued)

*Primary Examiner* — James McDonough
(74) *Attorney, Agent, or Firm* — Kilpatrick Townsend & Stockton LLP

(57) ABSTRACT

A high pressure apparatus and related methods for processing supercritical fluids. In a specific embodiment, the present apparatus includes a capsule, a heater, at least one ceramic ring but can be multiple rings, optionally, with one or more scribe marks and/or cracks present. In a specific embodiment, the apparatus optionally has a metal sleeve containing each ceramic ring. The apparatus also has a high-strength enclosure, end flanges with associated insulation, and a power control system. In a specific embodiment, the apparatus is capable of accessing pressures and temperatures of 0.2-2 GPa and 400-1200° C., respectively.

13 Claims, 7 Drawing Sheets

U.S. PATENT DOCUMENTS

| | | |
|---|---|---|
| 6,372,002 B1 | 4/2002 | D'Evelyn et al. |
| 6,398,867 B1 | 6/2002 | D'Evelyn et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,541,115 B2 | 4/2003 | Pender et al. |
| 6,596,040 B2 | 7/2003 | Kim et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,765,240 B2 | 7/2004 | Tischler et al. |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,936,488 B2 | 8/2005 | D'Evelyn et al. |
| 6,955,719 B2 | 10/2005 | Dmitriev et al. |
| 7,009,215 B2 | 3/2006 | D'Evelyn et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,122,827 B2 | 10/2006 | Alizadeh et al. |
| 7,125,453 B2 * | 10/2006 | D'Evelyn et al. ............ 117/200 |
| 7,160,388 B2 | 1/2007 | Dwilinski et al. |
| 7,160,531 B1 | 1/2007 | Jacques et al. |
| 7,175,704 B2 | 2/2007 | D'Evelyn et al. |
| 7,208,393 B2 | 4/2007 | Haskell et al. |
| 7,220,658 B2 | 5/2007 | Haskell et al. |
| 7,291,544 B2 | 11/2007 | D'Evelyn et al. |
| 7,316,746 B2 | 1/2008 | D'Evelyn et al. |
| 7,335,262 B2 | 2/2008 | Dwilinski et al. |
| 7,338,828 B2 | 3/2008 | Imer et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 2001/0011935 A1 | 8/2001 | Lee et al. |
| 2001/0048114 A1 | 12/2001 | Morita et al. |
| 2002/0105986 A1 | 8/2002 | Yamasaki |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0183155 A1 | 10/2003 | D'Evelyn et al. |
| 2003/0209191 A1 | 11/2003 | Purdy |
| 2004/0000266 A1 | 1/2004 | D'Evelyn et al. |
| 2004/0104391 A1 | 6/2004 | Maeda et al. |
| 2004/0161222 A1 | 8/2004 | Niida et al. |
| 2004/0222357 A1 | 11/2004 | King et al. |
| 2005/0098095 A1 | 5/2005 | D'Evelyn et al. |
| 2005/0109240 A1 | 5/2005 | Maeta et al. |
| 2005/0128469 A1 | 6/2005 | Hall et al. |
| 2005/0191773 A1 | 9/2005 | Suzuki et al. |
| 2005/0205215 A1 | 9/2005 | Giddings et al. |
| 2006/0030738 A1 | 2/2006 | Vanmaele et al. |
| 2006/0037529 A1 | 2/2006 | D'Evelyn et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0177362 A1 | 8/2006 | D'Evelyn et al. |
| 2006/0207497 A1 * | 9/2006 | D'Evelyn et al. ............ 117/71 |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0105351 A1 | 5/2007 | Motoki et al. |
| 2007/0141819 A1 | 6/2007 | Park |
| 2007/0142204 A1 | 6/2007 | Park et al. |
| 2007/0151509 A1 | 7/2007 | Park |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0008855 A1 | 1/2008 | D'Evelyn et al. |
| 2008/0083741 A1 * | 4/2008 | Giddings et al. ............ 219/534 |
| 2008/0087919 A1 | 4/2008 | Tysoe et al. |
| 2008/0156254 A1 | 7/2008 | Dwilinski et al. |
| 2008/0193363 A1 | 8/2008 | Tsuji |
| 2008/0272462 A1 | 11/2008 | Shimamoto |
| 2008/0285609 A1 | 11/2008 | Ohta et al. |
| 2009/0092536 A1 | 4/2009 | Kawabata et al. |
| 2009/0218593 A1 | 9/2009 | Kamikawa et al. |
| 2009/0301387 A1 | 12/2009 | D'Evelyn |
| 2009/0301388 A1 | 12/2009 | D'Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0147210 A1 | 6/2010 | D'Evelyn |
| 2010/0151194 A1 | 6/2010 | D'Evelyn |
| 2010/0219505 A1 | 9/2010 | D'Evelyn |
| 2010/0295088 A1 | 11/2010 | D'Evelyn et al. |

FOREIGN PATENT DOCUMENTS

| | | |
|---|---|---|
| JP | 2007-039321 A | 2/2007 |
| WO | WO 2005121415 A1 | 12/2005 |

OTHER PUBLICATIONS

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwiliński et al, Ammono Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Feezell et al., "AlGaN-Cladding-Free Nonpolar InGaN/GaN Laser Diodes," Japanese Journal of Applied Physics, vol. 46, No. 13, pp. L284-L286.

Frayssinet et al., "Evidence of Free Carrier Concentration Gradient Along the c-axis for Undoped GaN Single Crystals," Journal of Crystal Growth, 2001, vol. 230, pp. 442-447.

ISO et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kojima et al., "Stimulated Emission at 474 nm from an InGaN Laser Diode Structure Grown on a (1122) GaN Substrate," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on $m$-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Sarva, et al. "Dynamic compressive strength of silicon carbide under uniaxial compression," Mat. Sci. & Eng. A 317,140 (2001).

Wang et al. "Ammonothermal growth of GaN crystals in alkaline solutions," Journal of crystal Growth 287:376-380 (Jan. 2006).

International Search Report and Written Opinion of the International Searching Authority for PCT Application No. US/2009/046252; mailed on Jul. 29, 2009; 12 pages.

Office action for U.S. Appl. No. 12/497,969 (Feb. 2, 2012).
Office action for U.S. Appl. No. 12/534,838 (Jan. 13, 2012).
Office action for U.S. Appl. No. 12/569,841 (Dec. 23, 2011).
Office action for U.S. Appl. No. 12/724,983 (Mar. 5, 2012).
Office action for U.S. Appl. No. 12/785,404 (Mar. 6, 2012).

* cited by examiner

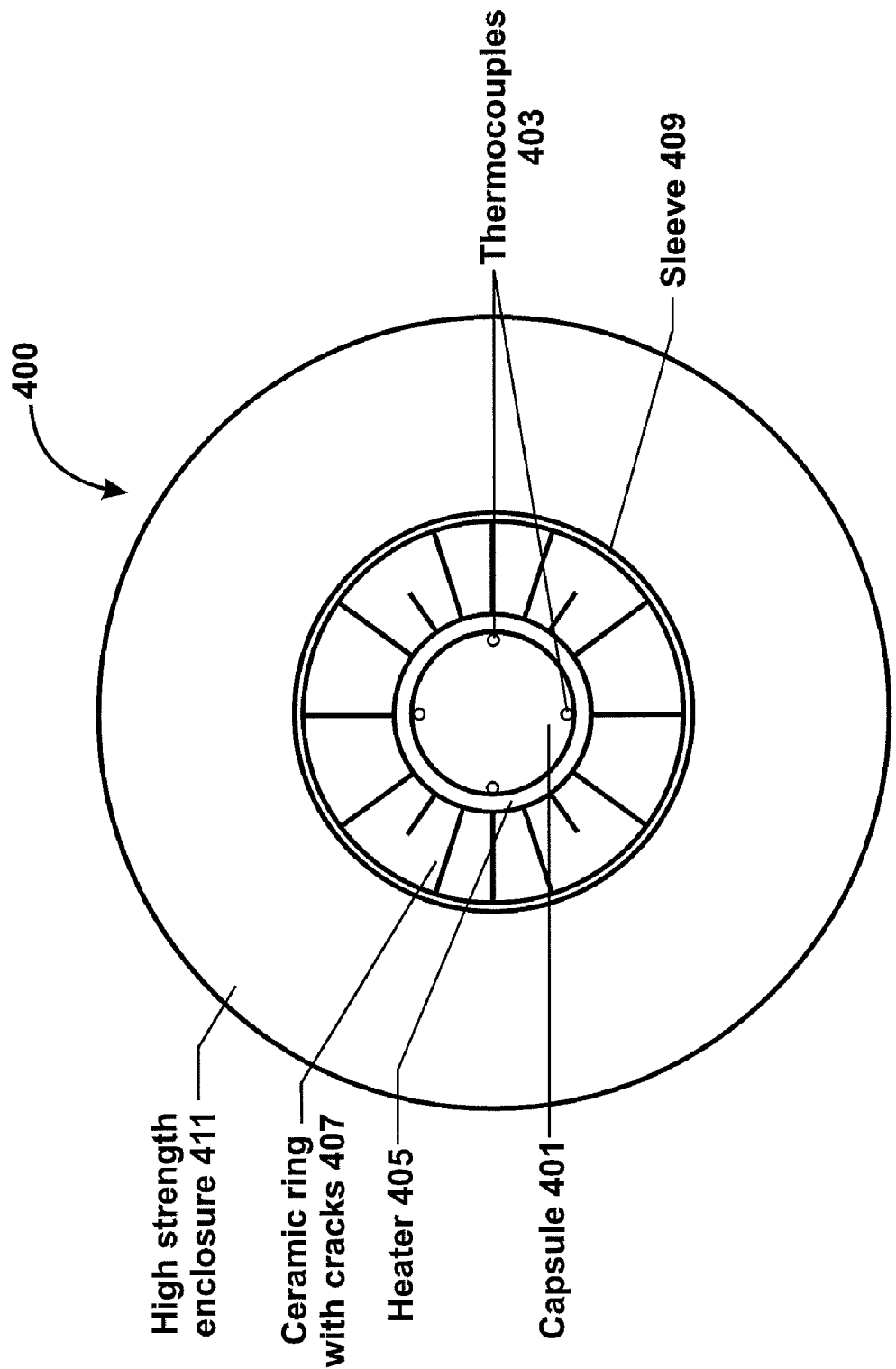

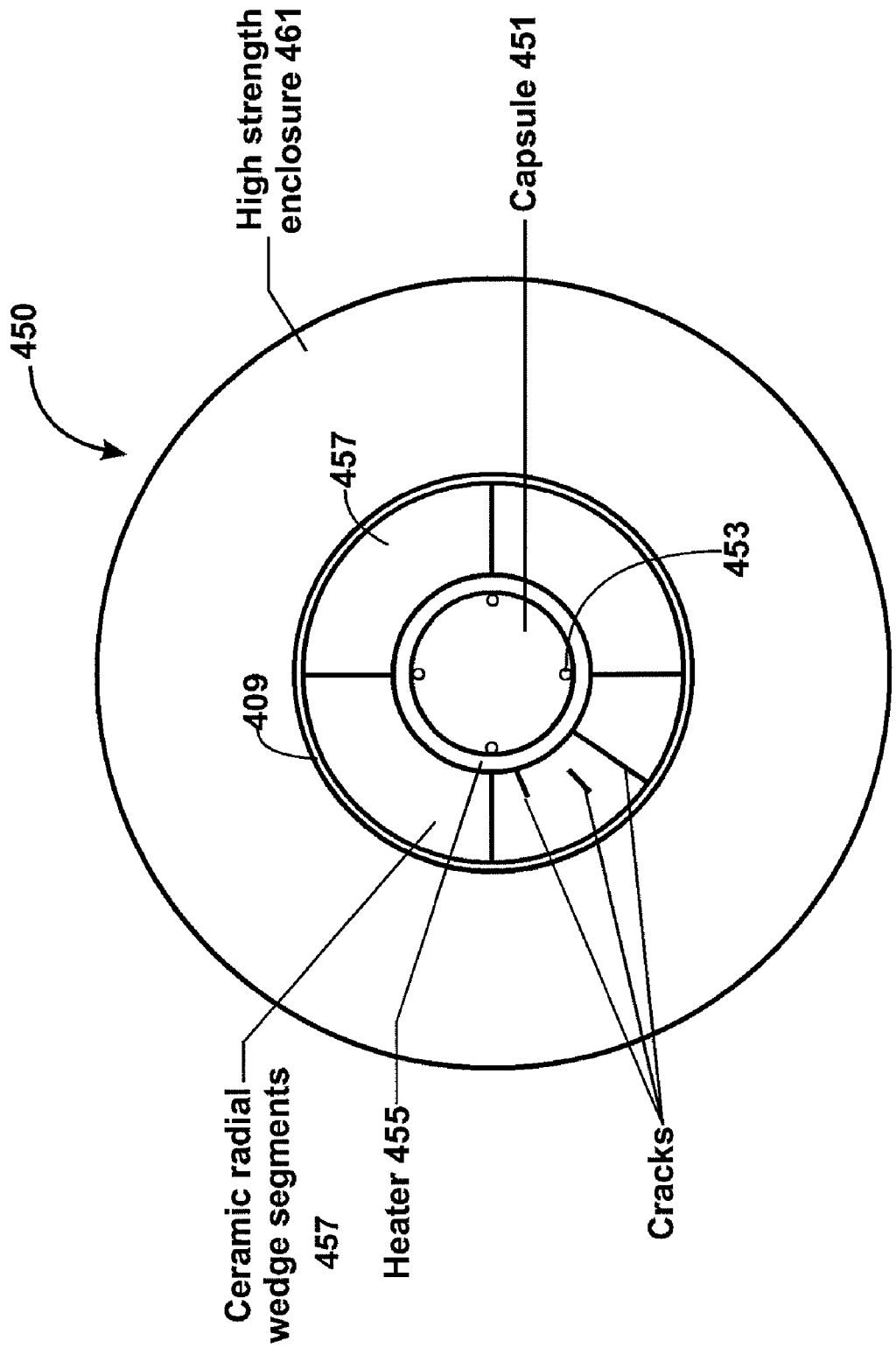

US 8,303,710 B2

HIGH PRESSURE APPARATUS AND METHOD FOR NITRIDE CRYSTAL GROWTH

CROSS-REFERENCES TO RELATED APPLICATIONS

This application claims priority to U.S. application Ser. No. 12/133,364, filed Jun. 5, 2008 and U.S. Provisional Patent No. 61/073,687, filed Jun. 18, 2008, commonly assigned, and both of which are hereby incorporated by reference for all purposes.

BACKGROUND OF THE INVENTION

The present invention relates generally to techniques for processing materials in supercritical fluids. More specifically, embodiments of the invention include techniques for controlling parameters associated with a material processing capsule disposed within a high-pressure apparatus enclosure. Merely by way of example, the invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Supercritical fluids are used to process a wide variety of materials. A supercritical fluid is often defined as a substance beyond its critical point, i.e., critical temperature and critical pressure. A critical point represents the highest temperature and pressure at which the substance can exist as a vapor and liquid in equilibrium. In certain supercritical fluid applications, the materials being processed are placed inside a pressure vessel or other high pressure apparatus. In some cases it is desirable to first place the materials inside a container, liner, or capsule, which in turn is placed inside the high pressure apparatus. In operation, the high pressure apparatus provides structural support for the high pressures generated within the container or capsule holding the materials. The container, liner, or capsule provides a closed/sealed environment that is chemically inert and impermeable to solvents, solutes, and gases that may be involved in or generated by the process.

Scientists and engineers have been synthesizing crystalline materials using high pressure techniques. As an example, synthetic diamonds are often made using high pressure and temperature conditions. Synthetic diamonds are often used for industrial purposes but can also be grown large enough for jewelry and other applications. Scientists and engineers also use high pressure to synthesize complex materials such as zeolites, which can be used to filter toxins and the like. Moreover, geologists have also used high pressure techniques to simulate conditions and/or processes occurring deep within the earth's crust. High pressure techniques often rely upon supercritical fluids, herein referred to as SCFs.

Supercritical fluids provide an especially ideal environment for growth of high quality crystals in large volumes and low costs. In many cases, supercritical fluids possess the solvating capabilities of a liquid with the transport characteristics of a gas. Thus, on the one hand, supercritical fluids can dissolve significant quantities of a solute for recrystallization. On the other hand, the favorable transport characteristics include a high diffusion coefficient, so that solutes may be transported rapidly through the boundary layer between the bulk of the supercritical fluid and a growing crystal, and also a low viscosity, so that the boundary layer is very thin and small temperature gradients can cause facile self-convection and self-stirring of the reactor. This combination of characteristics enables, for example, the growth of hundreds or thousands of large α-quartz crystals in a single growth run in supercritical water.

Supercritical fluids also provide an attractive medium for synthesis of exotic materials, such as zeolites, for solvent extractions, as of caffeine from coffee, and for decomposition and/or dissolution of materials that are relatively inert under more typical conditions, such as biofuels and toxic waste materials.

In some applications, such as crystal growth, the pressure vessel or capsule also includes a baffle plate that separates the interior into different chambers, e.g., a top half and a bottom half. The baffle plate typically has a plurality of random or regularly spaced holes to enable fluid flow and heat and mass transfer between these different chambers, which hold the different materials being processed along with a supercritical fluid. For example, in typical crystal growth applications, one portion of the capsule contains seed crystals and the other half contains nutrient material. In addition to the materials being processed, the capsule contains a solid or liquid that forms the supercritical fluid at elevated temperatures and pressures and, typically, also a mineralizer to increase the solubility of the materials being processed in the supercritical fluid. In other applications, for example, synthesis of zeolites or of nanoparticles or processing of ceramics, no baffle plate may be used for operation. In operation, the capsule is heated and pressurized toward or beyond the critical point, thereby causing the solid and/or liquid to transform into the supercritical fluid. In some applications the fluid may remain subcritical, that is, the pressure or temperature may be less than the critical point. However, in all cases of interest here, the fluid is superheated, that is, the temperature is higher than the boiling point of the fluid at atmospheric pressure. The term "supercritical" will be used throughout to mean "superheated", regardless of whether the pressure and temperature are greater than the critical point, which may not be known for a particular fluid composition with dissolved solutes.

Although somewhat effective for conventional crystal growth, drawbacks exist with conventional processing vessels. As an example, processing capabilities for conventional steel hot-wall pressure vessels (e.g., autoclaves) are typically limited to a maximum temperature of about 400 Degrees Celsius and a maximum pressure of 0.2 GigaPascals (GPa). Fabrication of conventional pressure vessels from nickel-based superalloys allows for operation at a maximum temperature of about 550 degrees Celsius and a maximum pressure of about 0.5 GPa. Therefore, these conventional hot-wall pressure vessels are often inadequate for some processes, such as the growth of gallium nitride crystals in supercritical ammonia that often require pressures and temperatures that extend significantly above this range in order to achieve growth rates above about 2-4 microns per hour. In addition, nickel-based superalloys are very expensive and are difficult to machine, limiting the maximum practical size and greatly increasing the cost compared to traditional steel pressure vessels.

Attempts have been made to overcome the drawbacks of conventional pressure vessels. D'Evelyn et al., US patent application 2003/0140845A1, indicates a so-called zero-stroke high pressure apparatus adapted from the type of belt apparatus used for synthesis of diamond using high pressure and high temperature. Cemented tungsten carbide, however, is used as the die material, which is relatively expensive and is difficult to manufacture in large dimensions. In addition, the use of a hydraulic press to contain the apparatus increases the cost and further limits the maximum volume. Finally, the use of a pressure transmission medium surrounding the capsule used to contain the supercritical fluid reduces the volume available within the hot zone for processing material.

D'Evelyn et al., US patent application 2006/0177362A1, indicates several types of apparatus with capability for pressures and temperatures well in excess of that of conventional autoclaves and with improved scalability relative to the zero-stroke press apparatus described above. A series of wedge-shaped radial ceramic segments are placed between a heater which surrounds a capsule and a high-strength enclosure, in order to reduce both the pressure and temperature to which the inner diameter of the high-strength enclosure is exposed compared to the corresponding values for the capsule. Fabrication and use of these ceramic wedge-shaped radial segments, however, can be difficult and expensive. These and other limitations of conventional apparatus may be described throughout the present specification.

From the above, it is seen that techniques for improving a high pressure apparatus for crystal growth is highly desirable.

BRIEF SUMMARY OF THE INVENTION

According to the present invention, techniques related for processing materials in supercritical fluids are provided. More specifically, embodiments of the invention include techniques for controlling parameters associated with a material processing capsule disposed within a high-pressure apparatus/enclosure. Merely by way of example, the invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photo-detectors, integrated circuits, and transistors, and others.

In a specific embodiment, the present invention provides a high pressure apparatus and related methods for processing supercritical fluids. In a specific embodiment, the present apparatus includes a capsule, a heater, at least one ring (e.g., ceramic) but can be multiple rings, optionally, with one or more scribe marks and/or cracks present. In a specific embodiment, the apparatus optionally has a metal sleeve containing each ceramic ring. The apparatus also has a high-strength enclosure, end flanges with associated insulation, and a power control system. The apparatus is scalable up to very large volumes and is cost effective. In a specific embodiment, the apparatus is capable of accessing pressures and temperatures of 0.2-2 GPa and 400-1200° C., respectively. As used herein in a specific embodiment, the term "high-strength" generally means suitable mechanical and other features (e.g., tensile strength, Young's Modulus, yield strength, toughness, creep resistance, chemical resistance) that allow for use as a high pressure enclosure, such as a pressure vessel, which may be airtight, but may also not be air and/or gas tight). As an example, the term "high pressure" generally refers to above 0.1 GPa, 0.2 GPa, 0.5 GPa, and others, particularly in pressures suitable for growth of crystalline materials, including but not limited to GaN, AlN, InN, AlGaN, InGaN, AlInGaN, and other nitrides or oxides or metal or dielectric or semiconducting materials. In a specific embodiment, the high strength enclosure material is provided to form a high strength enclosure configured to withstand a load of greater than about 0.1 GPa (or 0.2 GPa or 0.5 GPa) for a predetermined time period at a temperature of about 200 Degrees Celsius or less. Of course, there can be other variations, modifications, and alternatives.

In an alternative specific embodiment, the present invention provides apparatus for high pressure crystal or material processing, e.g., GaN, AlN, InN, InGaN, AlGaN, and AlInGaN. The apparatus includes a capsule (e.g., capsule) region comprising a first region and a second region, and a length defined between the first region and the second region. The apparatus has an annular heating member enclosing the capsule region. The apparatus has at least one (for example, two or more) continuous annular ceramic (or metal or cermet) member having a predetermined thickness are arranged sequentially and disposed continuously around a perimeter of the annular heating member. In a preferred embodiment, the continuous annular members are made of a material having a compressive strength of about 0.5 GPa and greater and a thermal conductivity of about 4 watts per meter-Kelvin and less. In a specific embodiment, two or more irregularly shaped surface regions are spatially disposed within one or more of the annular members and paired to substantially mate with each other along a portion of a common boundary region. The apparatus also has a high strength enclosure material disposed overlying the annular ceramic member to form a high strength enclosure.

Still further, the present invention provides a method of crystal growth, e.g., GaN, AlN, InN, InGaN, AlGaN, and AlInGaN. The method includes providing an apparatus for high pressure crystal growth or material processing. The apparatus includes a capsule region (for example, cylindrical in shape) comprising a first region and a second region, and a length defined between the first region and the second region. The apparatus also has an annular heating member enclosing the capsule region. The apparatus has at least one continuous ceramic or annular metal or cermet member having a predetermined thickness disposed continuously around a perimeter of the annular heating member. In a preferred embodiment, the continuous annular member is made of a material having a compressive strength of about 0.5 GPa and greater and a thermal conductivity of about 4 watts per meter-Kelvin and less. The apparatus also has a high strength enclosure material disposed overlying the annular ceramic member. In a specific embodiment, the method also includes providing a capsule containing a solvent and placing the capsule within an interior region of the capsule region. In a specific embodiment, the method includes processing the capsule with thermal energy to cause an increase in temperature within the capsule to greater than 200 Degrees Celsius to cause the solvent to be superheated.

Moreover, depending upon the embodiment, the present method can also includes one of a plurality of optional steps. Optionally, the method includes forming a crystalline material from a process of the superheated solvent. Additionally, the method includes removing thermal energy from the capsule to cause a temperature of the capsule to change from a first temperature to a second temperature, which is lower than the first temperature. The method also includes removing a first flange and a second flange from the high pressure apparatus and moving a mechanical member, using a hydraulic drive force, from the first region of the capsule region toward the second region to transfer the capsule out of the capsule region. In a preferred embodiment, the present apparatus can be scaled up in size to a capsule volume of 0.3 liters, to about 300 liters and greater. Of course, there can be other variations, modifications, and alternatives.

Still further, the present invention provides a process of forming a crystalline material, e.g., GaN. The method includes providing an apparatus for high pressure crystal or material processing. The apparatus includes a capsule region comprising a first region and a second region, and a length defined between the first region and the second region. The apparatus also has an annular heating member enclosing the capsule region. At least one continuous annular member is included. The annular member includes a predetermined thickness disposed continuously around a perimeter of the annular heating member. In a specific embodiment, the continuous annular member is made of a material having a compressive strength of about 0.5 GPa and greater and a thermal conductivity of about 100 watts per meter-Kelvin and less. The apparatus also has a high strength enclosure material disposed overlying the annular member to form a high strength enclosure. The method includes providing a capsule containing a solvent and placing the capsule within an interior region of the capsule region. The method includes processing the capsule with thermal energy to cause an increase in temperature within the capsule to greater than 200 Degrees Celsius to cause the solvent to be superheated.

Benefits are achieved over pre-existing techniques using the present invention. In particular, the present invention enables a cost-effective high pressure apparatus for growth of crystals such as GaN, AlN, InN, InGaN, and AlInGaN and others. In a specific embodiment, the present method and apparatus can operate with components that are relatively simple and cost effective to manufacture, such as ceramic and steel tubes. A specific embodiment also takes advantage of the one or more cracks provided in the ceramic member, which insulates the heater. Depending upon the embodiment, the present apparatus and method can be manufactured using conventional materials and/or methods according to one of ordinary skill in the art. The present apparatus and method enable cost-effective crystal growth and materials processing under extreme pressure and temperature conditions in batch volumes larger than 0.3 liters, larger than 1 liter, larger than 3 liters, larger than 10 liters, larger than 30 liters, larger than 100 liters, and larger than 300 liters according to a specific embodiment. In a preferred embodiment, the present apparatus and related methods provides for selected dimensions and parameters that are important for scale up of a larger gallium nitride reactor, which has not been achieved using conventional techniques. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 4 is a simplified diagram of a cross-sectional view diagram of a high pressure apparatus according to an embodiment of the present invention.

FIG. 4A is a simplified cross-sectional view diagram of an alternative high pressure apparatus according to an alternative embodiment of the present invention.

DETAILED DESCRIPTION OF THE INVENTION

According to the present invention, techniques for processing materials in supercritical fluids are included. More specifically, embodiments of the invention include techniques for controlling parameters associated with a material processing capsule disposed within a high-pressure apparatus/enclosure. Merely by way of example, the invention can be applied to growing crystals of GaN, AlN, InN, InGaN, AlGaN, and AlInGaN for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors.

In a specific embodiment, the present invention provides a high pressure apparatus for processing materials. Depending upon the embodiment, the apparatus has been described with reference to a specific orientation relative to the direction of gravity. As an example, the apparatus is described as being vertically oriented. In another embodiment, the apparatus is instead horizontally oriented or oriented at an oblique angle intermediate between vertical and horizontal, and may be rocked so as to facilitate convection of the supercritical fluid within the capsule. Of course, there can be other variations, modifications, and alternatives.

Figure 1:
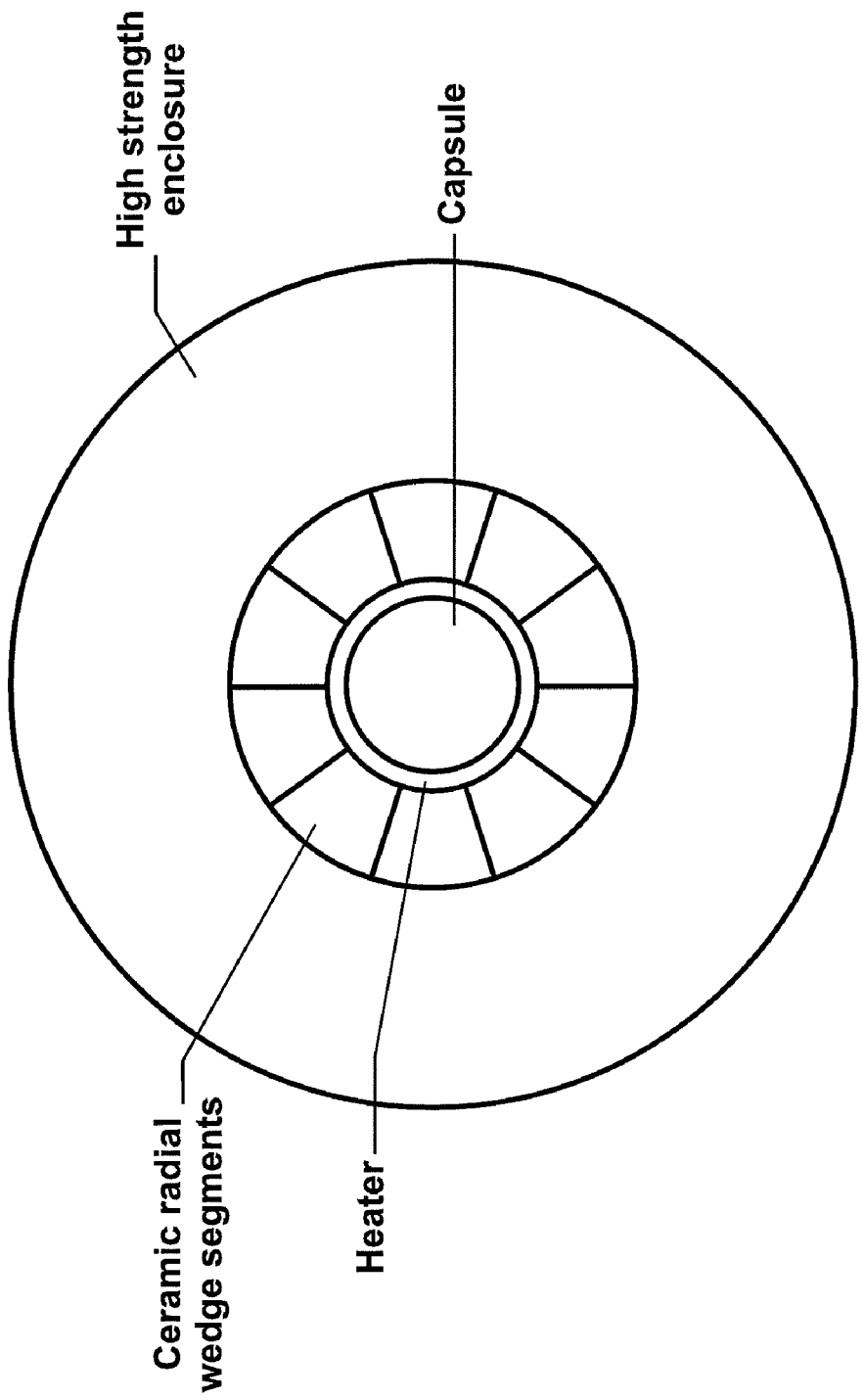
FIG. 1 is a simplified diagram of a conventional apparatus.

To provide a point of reference, the force-wedge apparatus described by D'Evelyn et al. in U.S. Patent Application No. 2006/0177362A1, which is incorporated by reference in its entirety herein, is shown in FIG. 1. A capsule, such as described in U.S. Pat. No. 7,125,453, is placed within a heater, such as that described in U.S. Patent Application No. 2008/0083741A1, each of which is incorporated by reference herein. Both are contained within a high-strength enclosure, which may be fabricated from SA 723 pressure vessel steel. Then from paragraph 51, "The process . . . includes disposing a plurality of radial segments between the high strength enclosure and the capsule (block 126). These radial segments are disposed one after another around a circumference of the capsule, such that each radial segment is a wedge-shaped portion of a segmented cylinder. The radial segment may comprise a ceramic, such as alumina, silicon nitride, silicon carbide, zirconia, or the like. The radial segment may alternatively comprise a refractory metal, such as tungsten, molybdenum, or TZM alloy, or a cermet, such as Co-cemented tungsten carbide." As noted, limitations exist with the conventional force wedge apparatus. That is, it is expensive to fabricate an apparatus with a large number of the radial segments. In addition, it is difficult to fabricate each of the radial segments accurately and to assemble them into the apparatus. It was discovered that providing one or more cracks in the radial segments do not detract from their performance, as long as the cracks do not form an interconnected network. Allowing for or deliberately introducing one or more cracks into the segments allows fabrication of the apparatus with a smaller number of segments. In addition, allowing for the presence of one or more cracks in the segments may reduce the manufacturing cost of the segments, as small flaws in the ceramic parts that might grow into cracks can now be tolerated.

Figure 2:
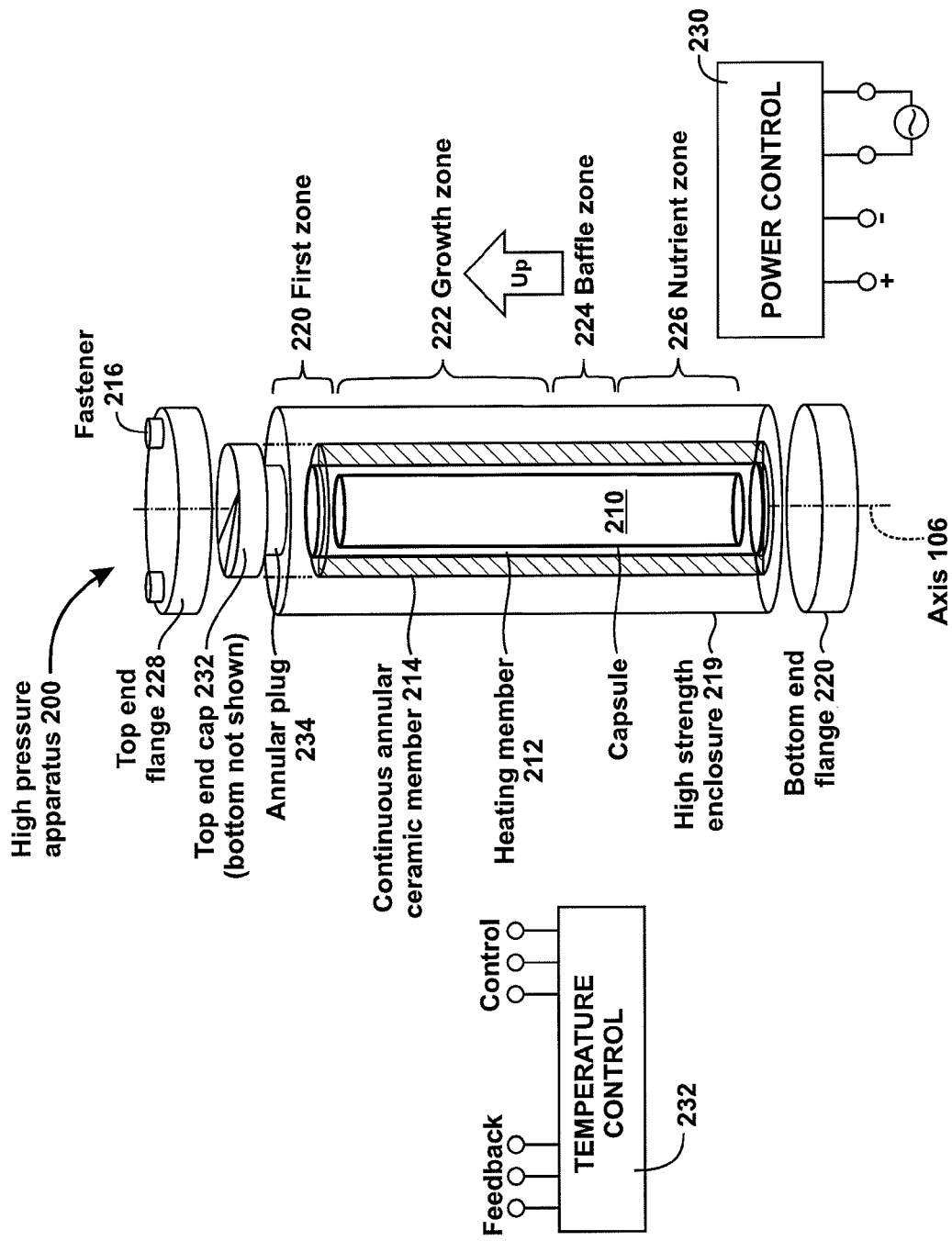
FIG. 2 is a simplified diagram of a high pressure apparatus according to an embodiment of the present invention.

FIG. 2 is a simplified diagram of a high pressure apparatus according to an embodiment of the present invention. This diagram is merely an example, which should not unduly limit the scope of the claims herein. One of ordinary skill in the art would recognize other variations, modifications, and alternatives. As shown, the present invention provides an apparatus for high pressure crystal or material processing, e.g., GaN, AlN, InN, InGaN, AlGaN, and AlInGaN. Other processing methods include hydrothermal crystal growth of oxides and other crystalline materials, hydrothermal or ammonothermal syntheses, and hydrothermal decomposition, and others. Of course, there can be other variations, modifications, and alternatives.

Referring to FIG. 2, high pressure apparatus 200 and related methods for processing supercritical fluids are disclosed. In a specific embodiment, the present apparatus 200 includes a capsule 210, a heating member or heater 212, at least one ceramic ring 214 but can be multiple rings, optionally, with one or more scribe marks and/or cracks present. In a specific embodiment, the apparatus optionally has one or more metal sleeves (not shown) containing each ceramic ring. The apparatus also has a high-strength enclosure 218, end flanges 226, 228 with associated insulation, and a power control system 230. The apparatus is scalable up to very large volumes and is cost effective. In a specific embodiment, the apparatus is capable of accessing pressures and temperatures of 0.2-2 GPa and 400-1200° C., respectively. In a specific embodiment, the apparatus also includes a temperature controller 232. Of course, there can be other variations, modifications, and alternatives.

In a specific embodiment, apparatus 200 comprises at least one heat zone and optionally more, such as multiple, including two or more. The heat zones include an uppermost first zone 220, a growth zone 222, a baffle zone 224, and a charge or nutrient zone 226 according to a specific embodiment. When a capsule is inserted into the volume defined by a heater inner surface, an internal baffle (not shown) aligns with the baffle gap zone according to a specific embodiment. The baffle defines two chambers inside the capsule, one for nutrient and one for growth according to a specific embodiment. The two chambers communicate through the perforated baffle, which can have various shapes and configurations. In the illustrated embodiment, appropriate for crystal growth when the solubility of the material to be recrystallized is an increasing function of temperature, the growth zone is located above the nutrient zone. In other embodiments, appropriate for crystal growth when the solubility of the material to be recrystallized is a decreasing function of temperature, i.e., retrograde solubility, the growth zone is located below the nutrient zone. In still other embodiments, apparatus 200 is approximately horizontal rather than vertical and may be fitted with a rocking mechanism (not shown).

In an embodiment, the capsule suitable for insertion inside the heater is formed from a precious metal. Examples of precious metals include platinum, palladium, rhodium, gold, or silver. Other metals can include titanium, rhenium, copper, stainless steel, zirconium, tantalum, alloys thereof, and the like. In an embodiment, the metal functions as an oxygen getter. Suitable capsule dimensions may be greater than 2 cm in diameter and 4 cm in length. In one embodiment, the dimension of the diameter is in a range selected from any of: 2-4 cm, 4-8 cm, 8-12 cm, 12-16 cm, 16-20 cm, 20-24 cm, and greater than 24 cm. In a second embodiment, the ratio of the length to diameter of the capsule is greater than 2. In yet another embodiment, the ratio of length to diameter is in a range of any of: 2 to 4, 4 to 6, 6 to 8, 8 to 9, 9 to 10, 10 to 11, 11 to 12, 12 to 14, 14 to 16, 16 to 18, 18 to 20, and greater than 20. Of course, there can be other variations, modifications, and alternatives.

In an embodiment, the growth zone 222 volume has twice the charge zone 226 volume. The electrical circuits for each heating element segment are independently controlled. Independent control provides flexibility to achieve and maintain a heat deposition profile along the capsule height. A physical discontinuity between the second and third heater segments, from the top, produces a local dip in temperature near a baffle plate disposed in the capsule and separating the charge zone 226 from the growth zone 222. In an embodiment, the charge zone and the growth zone are isotherms at temperatures that differ from each other. The baffle zone has a temperature gradient over a relatively small distance between the charge zone and the growth zone isotherms. The winding patterns of the heating elements, and the resultant isotherms with minimal temperature gradient spacing therebetween minimize or eliminate wall nucleation inside the capsule and in or on the baffle. In an embodiment, the growth zone may be at the bottom and the charge zone at the top. Such configurations may be based on specific chemistries and growth parameters.

With particular reference to FIG. 2, the heater 212 is disposed in an apparatus 200 that includes a vessel or high strength enclosure 218. Attachable to the top end of the vessel is first end flange 228, and to the bottom end is a second end flange 226. A plurality of fasteners 216 (only one of which is indicated with a reference number) secure the end flanges to the vessel ends.

Within the vessel 218, continuous annular ceramic member 214 lines the vessel inner surface and contacts the outer surface of the heater 212. Examples of annulus materials include but are not limited to zirconium oxide or zirconia. First and second end caps 232 (only one of which is shown) are located proximate to the ends of the heater 212 inside the vessel. An annular plug 234 is shown as stacked disks, but may be an annulus surrounding the cap 232. The plug 234 optionally can be disposed on at least one end and within a cavity between the capsule and the end flange to reduce axial heat loss and may comprise zirconium oxide or zirconia. Alternative plug materials may include magnesium oxide, salts, and phyllosilicate minerals such as aluminum silicate hydroxide or pyrophyllite according to a specific embodiment.

Apparatus 200 may include a pressure transmission medium between the axial ends (See reference numeral 106) of the capsule and the end caps and/or annular plugs according to a specific embodiment. The pressure transmission medium may comprise sodium chloride, other salts, or phyllosilicate minerals such as aluminum silicate hydroxide or pyrophyllite or other materials according to a specific embodiment. However, notwithstanding the optional presence of a coating or foil to decrease friction and promote the sliding removal of the capsule after operation, the interface between the outer diameter of the capsule and the inner diameter of the heating member may be substantially free of pressure transmission medium. In addition, the interface between the outer diameter of the heating member and the inner diameter of the continuous annular ring is substantially free of pressure transmission medium.

The illustrated apparatus 200 can be used to grow crystals under pressure and temperature conditions desirable for crystal growth, e.g., gallium nitride crystals under related process conditions. The high-pressure apparatus 200 can include one or more structures operable to support the heater 212 radially, axially, or both radially and axially. The support structure in one embodiment thermally insulates the apparatus 200 from the ambient environment, and such insulation may enhance or improve process stability, maintain and control a desired temperature profile. Of course, there can be other variations, modifications, and alternatives.

In a specific embodiment, the apparatus includes a capsule region (for example, having a cylindrical shape) comprising a first region and a second region, and a length defined between the first region and the second region. In a specific embodiment, a capsule is disposed within the capsule region. As an example, the capsule is made of a suitable material that is chemically inert, can withstand pressure, and may also be easy to handle, among other features. Depending upon the embodiment, the capsule is made of a material selected from gold, platinum, silver, or palladium. Of course, there can also be other suitable materials, which can also include alloys, coatings, and/or multi-layered structures, depending upon the specific embodiment. Other metals can include titanium, rhenium, copper, stainless steel, zirconium, tantalum, alloys thereof, and the like. In a specific embodiment, the capsule is characterized by a deformable material and is substantially chemically inert relative to one or more reactants within the capsule region. An example of a capsule is described in U.S. Pat. No. 7,125,453, which is incorporated by reference herein for all purposes. Of course, there can be other variations modifications, and alternatives.

In a specific embodiment, the apparatus has an annular heating member enclosing the capsule region. Another example of a heating member is described in U.S. Patent Application No. 2008/0083741A1, which is also incorporated by reference herein. The heating member may have at least two independently controllable hot zones and may be capable of generating heating power as large as 3 kilowatts, 10 kilowatts, 30 kilowatts, 100 kilowatts, 300 kilowatts, or 1000 kilowatts. Of course, there can be other variations, modifications, and alternatives.

In a specific embodiment, the apparatus has at least one continuous annular ceramic or metal or cermet member having a predetermined thickness disposed continuously around a perimeter of the annular heating member. In a specific embodiment, the continuous annular member is made of a material having a compressive strength of about 0.5 GPa and greater and a thermal conductivity of about 4 watts per meter-Kelvin and less. As an example, the ceramic material can comprise rare earth metal oxide, zirconium oxide, hafnium oxide, magnesium oxide, calcium oxide, aluminum oxide, yttrium oxide, sialon (Si—Al—O—N), silicon nitride, silicon oxynitride, garnets, cristobalite, and mullite. The ceramic material may be a composite, comprising more than one phase. Alternatively, as an example, the metal can be a refractory metal such as tungsten, molybdenum, TZM alloy, and others. The cermet can be cobalt-cemented tungsten carbide, and others. In an alternative embodiment, which will be described further below, the continuous annular ceramic, metal, or cermet member is configured to include a plurality of crack regions disposed in a non-symmetrical manner and disposed between an inner diameter of the continuous annular ceramic, metal, or cermet member and an outer diameter of the continuous annular ceramic, metal, or cermet member. In a specific embodiment, the annular member is one of a plurality of members, which are stacked on top of each other. Of course, there can be other variations, modifications, and alternatives.

In a specific embodiment, the apparatus also has a cylindrical sleeve member disposed overlying the at least annular ceramic, metal or cermet member. As an example, the cylindrical sleeve member is made of a material selected from stainless steel, iron, steel, iron alloy, nickel or nickel alloy, cobalt or cobalt alloy, or any combinations thereof. In a specific embodiment, the cylindrical sleeve member comprises a first end and a second end. In a specific embodiment, the cylindrical sleeve has determined dimensions.

Depending upon the embodiment, the first end is characterized by a first outer diameter and the second end is characterized by a second outer diameter, which is less than the first outer diameter, to form a taper angle between an axis of the cylindrical sleeve member and an outer region of the cylindrical sleeve member, the taper angle ranging from about 0.1 to 5 Degrees. Of course, there can be other variations, modifications, and alternatives.

Additionally, the cylindrical sleeve member comprises a substantially constant inner diameter from the first end to the second end according to a specific embodiment, although the inner diameter can also vary depending upon the embodiment. In a preferred embodiment, the cylindrical sleeve member is configured to compress the continuous annular ceramic member in cooperation with the high pressure enclosure material. In a preferred embodiment, the cylindrical sleeve member is configured to provide mechanical support to maintain a determined shape of the continuous annular ceramic member. In a more preferred embodiment, the cylindrical sleeve is configured to compress the continuous annular ceramic member in cooperation with the high pressure enclosure material and is configured to provide mechanical support to maintain a determined shape of the continuous annular ceramic member. Of course, there can be other variations, modifications, and alternatives.

In a specific embodiment, the apparatus has a high strength enclosure material disposed overlying the annular ceramic member. In a specific embodiment, the high strength enclosure is made of a suitable material to house internal contents including capsule, heater, sleeve, among other elements. In a specific embodiment, the high strength enclosure is made of a material selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel, Inconel, Hastelloy, Udimet 500, Stellite, Rene 41, and Rene 88. In a preferred embodiment, the high strength enclosure comprises a material with ultimate tensile strength and yield strength characteristics so as to be rated by the American Society of Mechanical Engineers for continuous operation as a pressure vessel at a pressure higher than 50,000 pounds per square inch. Of course, one of ordinary skill in the art would recognize other variations, modifications, and alternatives.

The high strength enclosure also has a desired length and width according to a specific embodiment. In a specific embodiment, the high strength enclosure has a length and an inner diameter to define an aspect ratio between about 2 to about 25. The high strength enclosure has a length and an inner diameter to define an aspect ratio of about ten to about twelve. In a specific embodiment, the inner diameter is between about two inches and about fifty inches. In a specific embodiment, the height of the high strength enclosure is between 6 inches and 500 inches. The ratio between the outer diameter and the inner diameter of the high strength enclosure may be between 1.2 and 5. In a specific embodiment, the diameter ratio may be between about 1.5 and about 3. Of course, there can be other variations, modifications, and alternatives. Further details of the present apparatus can be found throughout the present specification and more particularly below.

Figure 3:
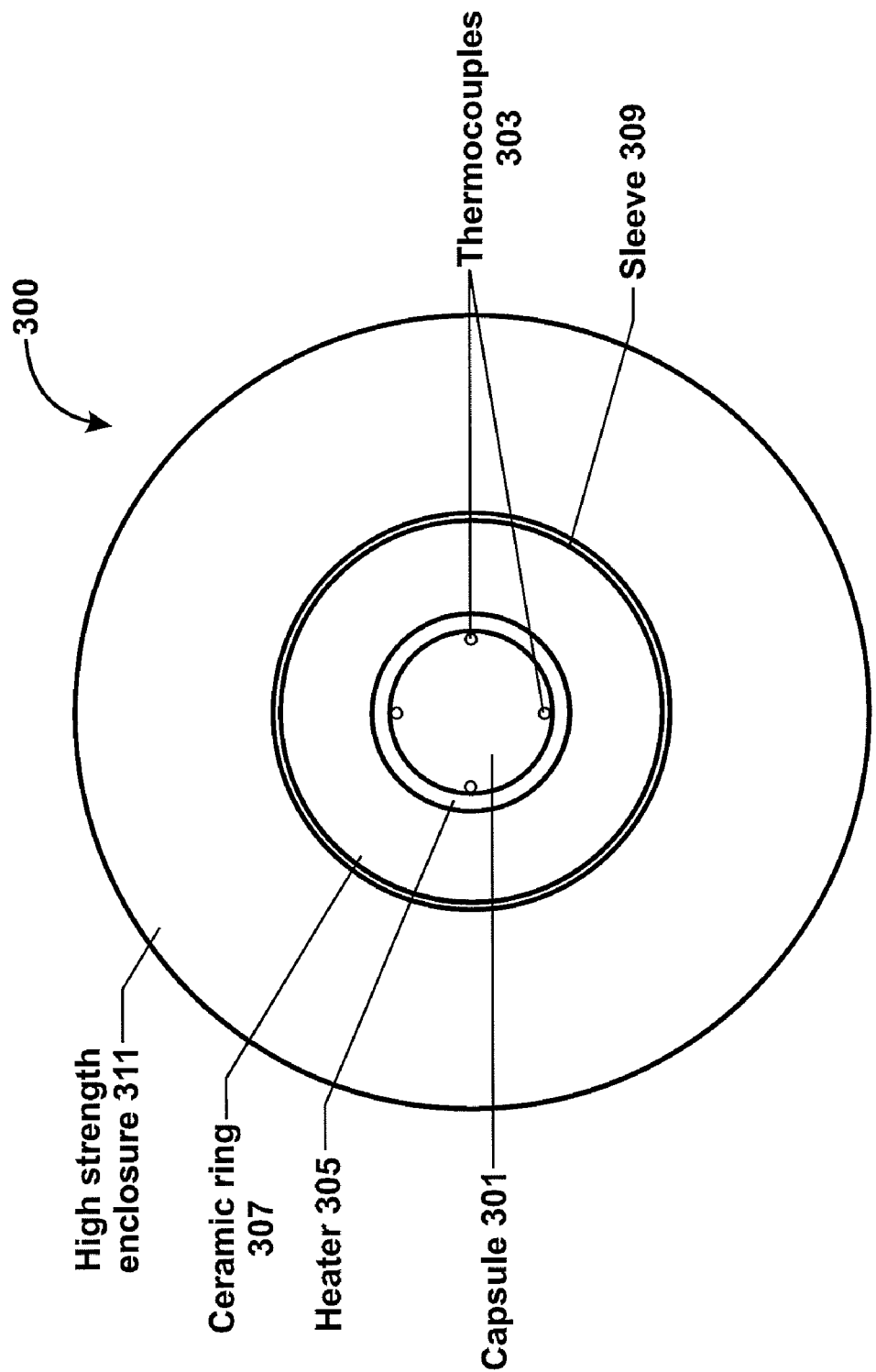
FIG. 3 is a simplified diagram of a cross-sectional view diagram of a high pressure apparatus according to an embodiment of the present invention.

In a specific embodiment, the present apparatus 300 is illustrated by way of FIG. 3. This diagram is merely an example, which should not unduly limit the scope of the claims herein. One of ordinary skill in the art would recognize other variations, modifications, and alternatives. Instead of individual radial segments disposed one after another within the apparatus, one or more rings 307 may be stacked within the apparatus. The ring may comprise a ceramic, such as alumina, silicon nitride, silicon carbide, zirconia, or the like, including other materials described herein as well as outside of the specification, which are known to one of ordinary skill in the art. The ring may alternatively comprise a refractory metal, such as tungsten, molybdenum, or TZM alloy, or a cermet, such as Co-cemented tungsten carbide. The ring may have an inner diameter between 0.5 inch and 24 inches, an outer diameter between 1 inch and 48 inches, and a height between 1 inch and 96 inches. In a specific embodiment, the inner diameter is between about 1.5 inches and about 8 inches and the height is between 1.5 inches and 8 inches. The ratio between the outer diameter and the inner diameter of the rings may be between 1.05 and 60. In a specific embodiment, the diameter ratio may be between about 1.5 and about 3. The ring may have a density greater than 95% of theoretical density. The modulus of rupture of the ring material may be greater than 200 or 450 MPa. The fracture toughness of the ring material may be greater than 9 MPa-m$^{1/2}$. Depending on the dimensions of the rings and of the high-strength enclosure, one to 200 rings may be stacked on top of one another inside the high-strength enclosure.

In a specific embodiment, a spacer, with a thickness between 0.001 inch and 0.1 inch, may be placed between successive rings in the stack to allow for thermal expansion. A sleeve 309 may be placed around each ring. The sleeve may comprise steel or other suitable material according to a specific embodiment. The sleeve may be between 0.020 inch and 0.5 inch thick, and their height may be between 0.25 inch less than that of the ring and 0.1 inch greater than that of the ring depending upon the embodiment. The apparatus also includes a capsule 301, thermocouples 303, which are coupled electrically to temperature controller and/or power controller, a heater 305, a high strength enclosure 311, among other elements. Of course, there can be other variations, modifications, and alternatives.

In a specific embodiment the ceramic rings do not crack significantly under operating conditions, as represented in FIG. 3. The fracture strength of the rings may be higher than the operating pressure of the capsule, for example. In another embodiment, radial compressive loading of the rings is provided by an interference fit with the high strength enclosure. In an embodiment, an interference fit is achieved by at least one of heating of the high strength enclosure and cooling of the ring prior to assembly. In another embodiment, an interference fit is achieved by grinding a slight taper, for example, approximately one degree, on the inner diameter of the high strength enclosure and on the ring and/or the sleeve surrounding the ring, and then pressing the ring and sleeve into the high strength enclosure to achieve the interference fit.

In another embodiment, the rings have at least one crack under operating conditions in the apparatus 400, as shown in FIG. 4. In a specific embodiment, the rings 407 are inserted into the high strength enclosure and allowed to crack during initial operation. Cracking in particular positions may be facilitated by scribing the inner diameter of the ring at the points of the desired crack initiation. The resulting cracks may run all the way from the inner diameter to the outer diameter, or they may terminate within the volume of the ring and/or have any combinations of these structures. In another embodiment, the rings are cracked prior to insertion into the high strength enclosure. Pre-cracking may be achieved by sliding a precision-turned rod having a larger coefficient of thermal expansion than the ring into the inner diameter of the ring and heating. The sleeve 409 surrounding the ring will keep and maintain all parts of the ring together and precisely oriented with respect to each other in the event that cracks run completely through the ring at various radial positions. In another embodiment, cracks are present within the volume of the ring and contact neither the inner diameter nor the outer diameter of the ring. The apparatus 400 also includes a capsule 401, thermocouples 403, which are coupled electrically to temperature controller and/or power controller, a heater 405, a high strength enclosure 411, among other elements. Of course, there can be other variations, modifications, and alternatives.

FIG. 4A is a simplified cross-sectional view diagram of an alternative high pressure apparatus according to an alternative embodiment of the present invention. In a specific embodiment, the two or more annular segments 457, which form a continuous ring structure, are inserted into the high strength enclosure and allowed to crack during initial operation. In a specific embodiment, there are two or more annular segments or three or more annular segments or four or more annular segments or other combinations, where each of the segments may have a similar length or different lengths. Cracking in particular positions may be facilitated by scribing the inner diameter of the two or more annular segments at the points of the desired crack initiation. The resulting cracks may run all the way from the inner diameter to the outer diameter, or they may terminate within the volume of the two or more annular segments and/or have any combinations of these structures.

In another embodiment, the two or more annular segments are cracked prior to insertion into the high strength enclosure. Pre-cracking may be achieved by sliding a precision-turned rod having a larger coefficient of thermal expansion than the two or more annular segments into the inner diameter of the segmented rings and heating them. The sleeve 409 surrounding the segments will keep and maintain all parts of the segments together and precisely oriented with respect to each other, including the case where cracks run completely through the segments at various radial positions. In another embodiment, cracks are present within the volume of the segments and contact neither the inner diameter nor the outer diameter of the segments. The apparatus 450 also includes a capsule 451, thermocouples 453, which are coupled electrically to temperature controller and/or power controller, a heater 455, a high strength enclosure 461, among other elements.

In a specific embodiment, the present method and related annular segments include slight irregularities and/or imperfections. In a specific embodiment, the segments are made of a suitable material that can accommodate itself by cracking. Additionally, slight changes in dimensions of each of the ceramic members are also accommodated by the cracks, which allows the assembly to be disposed around the heating member in a substantially continuous manner. In a specific embodiment, the present apparatus and related device prevents any rupture of a capsule and/or high strength enclosure by providing a buffer and/or insulating region between the capsule and high strength enclosure. Of course, there can be other variations, modifications, and alternatives.

The vertical dimension runs out of the page in FIGS. 3, 4, and 4A. The top and bottom of the cavity defined by the inner diameter of the rings is terminated by insulating plugs positioned proximate to end flanges, as shown in FIG. 2. The end flanges may be attached to the high strength enclosure by means of bolts. The length-to-diameter ratio of the cavity should be at least 2:1 and more preferably lies in the range between 5:1 and 15:1.

In order to measure the temperature at various heights on the outer diameter of the capsule, prior to assembly at least one axial dent or groove is placed on the outer diameter of the capsule at specified radial positions. In the examples shown in FIGS. 3 and 4, four dents or grooves are placed 90 degrees apart along the outer diameter of the capsule. The groove or dent may extend the entire height of the capsule or may terminate at the height along the capsule where a temperature measurement is desired. The width and depth of the groove or dent may be between about 0.025 inch and 0.130 inch. Holes slightly larger in diameter than the thermocouple may be placed in one or both end flanges. Holes or grooves may also be placed in at least one insulating cylinder separating the end flange from the capsule. Thermocouples may be inserted into the grooves or dents after insertion of the capsule into the heater, followed by placement of the end flanges onto the high strength enclosure. Alternatively, one or more thermocouples may be inserted into the grooves or dents prior to placement of the end flanges, and the free ends strung through the end flanges prior to placement of the latter and attachment of the electrical connections to the free ends of the thermocouples. Further details of methods according to embodiments of the present invention are provided below.

A method according to a specific embodiment is briefly outlined below.

1. Provide an apparatus for high pressure crystal growth or material processing, such as the one described above, but can be others, the apparatus comprising a capsule region (for example, cylindrical in shape) comprising a first region and a second region, and a length defined between the first region and the second region, an annular heating member enclosing the capsule region, at least one continuous ceramic or annular metal or cermet member having a predetermined thickness disposed continuously around a perimeter of the annular heating member and an high strength enclosure material disposed overlying the annular ceramic member;
2. Provide capsule containing a solvent;
3. Place the capsule within an interior region of the capsule region;
4. Process the capsule with thermal energy to cause an increase in temperature within the capsule to greater than 200 Degrees Celsius to cause the solvent to be superheated;
5. Form a crystalline material from a process of the superheated solvent;
6. Remove thermal energy from the capsule to cause a temperature of the capsule to change from a first temperature to a second temperature, which is lower than the first temperature;
7. Remove a first flange and a second flange from the high pressure apparatus;
8. Move a mechanical member, using a hydraulic drive force, from the first region of the capsule region toward the second region to transfer the capsule out of the capsule region;
9. Open the capsule;
10. Remove the crystalline material; and
11. Perform other steps, as desired.

The above sequence of steps provides a method according to an embodiment of the present invention. In a specific embodiment, the present invention provides a method and resulting crystalline material provided by a high pressure apparatus having structured support members. Other alternatives can also be provided where steps are added, one or more steps are removed, or one or more steps are provided in a different sequence without departing from the scope of the claims herein. Details of the present method and structure can be found throughout the present specification and more particularly below.

Figure 5:
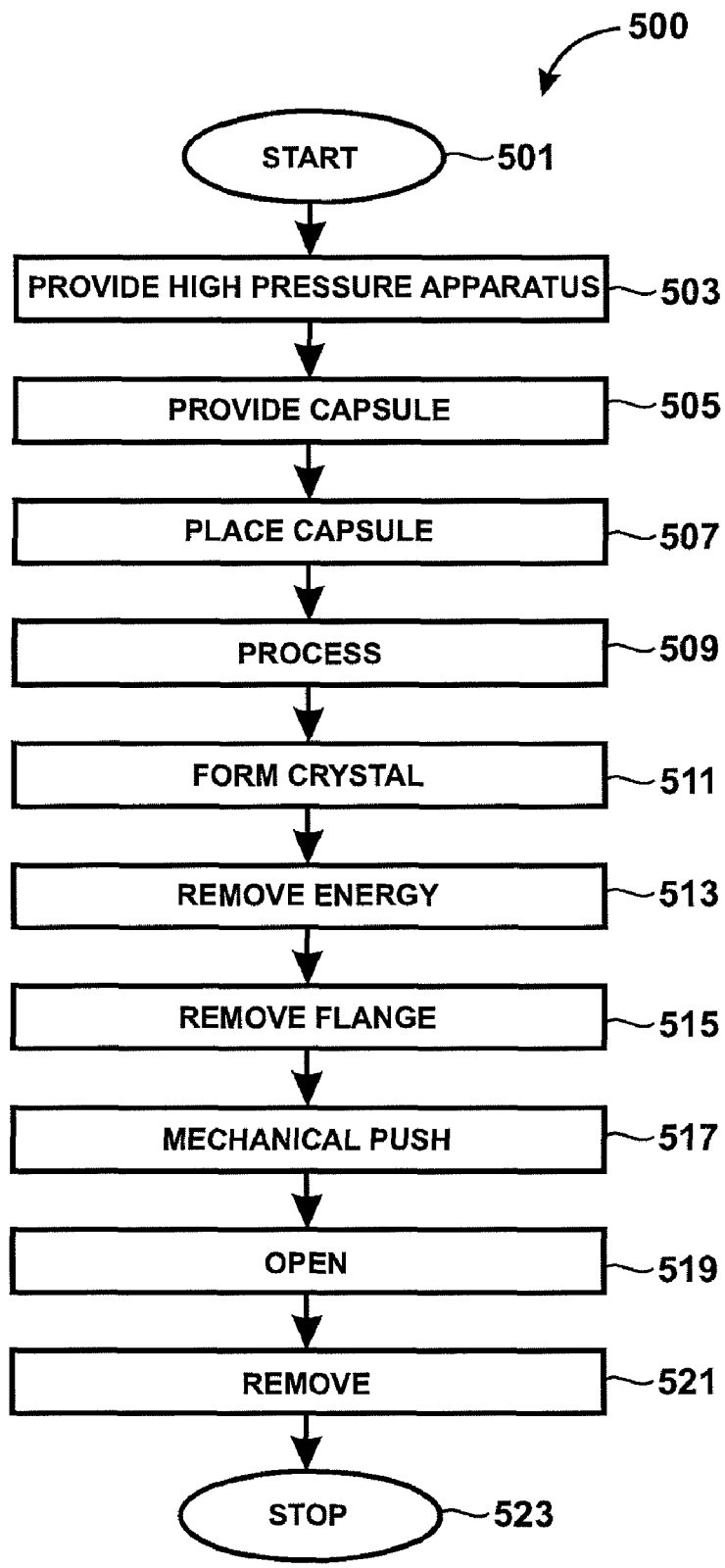
FIG. 5 is a simplified flow diagram of a method of processing a material within a supercritical fluid according to an embodiment of the present invention.

FIG. 5 is a simplified diagram 500 of a method of processing a supercritical fluid according to an embodiment of the present invention. This diagram is merely an example, which should not unduly limit the scope of the claims herein. One of ordinary skill in the art would recognize other variations, modifications, and alternatives. In a specific embodiment, the method beings with start, step 501. The method begins by providing (step 503) an apparatus for high pressure crystal or material processing, such as the one described above, but can be others. In a specific embodiment, the apparatus has a capsule region comprising a first region and a second region, and a length defined between the first region and the second region. The apparatus also has an annular heating member enclosing the capsule region, at least one continuous ceramic or annular metal or cermet member having a predetermined thickness disposed continuously around a perimeter of the annular heating member and a high strength enclosure material disposed overlying the annular ceramic member. Of course, there can be other variations, modifications, and alternatives.

In a specific embodiment, the method provides (step 505) a capsule containing a solvent, such as ammonia, for example. In a specific embodiment, the method places (step 507) the capsule containing the solvent and starting crystal within an interior region of the capsule region. The method processes (step 509) the capsule with thermal energy to cause an increase in temperature within the capsule to greater than 200 Degrees Celsius to cause the solvent to be superheated. Of course, there can be other variations, modifications, and alternatives.

Referring again to FIG. 5, the method forms (step 511) a crystalline material from a process of the superheated solvent. In a preferred embodiment, the crystalline material is gallium containing crystal such as GaN, AlGaN, InGaN, and others. In a specific embodiment, the method removes (step 513) thermal energy from the capsule to cause a temperature of the capsule to change from a first temperature to a second temperature, which is lower than the first temperature. Once the energy has been removed and temperature reduced to a suitable level, the method removes one or more flanges (step 515), which mechanically held at least the capsule in place. In a preferred embodiment, the method uses a mechanical member, such as a plunger, to hydraulically move (step 517) the mechanical member from the first region of the capsule region toward the second region to transfer the capsule out of the capsule region free from the apparatus.

In a specific embodiment, the capsule is now free from the apparatus. In a specific embodiment, the capsule is opened, step 519. In a preferred embodiment, the crystalline material is removed from an interior region of the capsule, step 521. Depending upon the embodiment, there can also be other steps, which can be inserted or added or certain steps can also be removed. In a specific embodiment, the method ends at stop, step 523. Of course, there can be other variations, modifications, and alternatives.

The above sequence of steps provides a method according to an embodiment of the present invention. In a specific embodiment, the present invention provides a method and resulting crystalline material provided by a high pressure apparatus having structured support members. Other alternatives can also be provided where steps are added, one or more steps are removed, or one or more steps are provided in a different sequence without departing from the scope of the claims herein.

A method according to an alternative specific embodiment is briefly outlined below.

1. Assemble an apparatus for high pressure crystal or material processing, such as the one described above, but can be others, the apparatus comprising a capsule region comprising a first region and a second region, and a length defined between the first region and the second region, an annular heating member enclosing the capsule region, at least one continuous ceramic or annular metal or cermet member having a predetermined thickness disposed continuously around a perimeter of the annular heating member and an high strength enclosure material disposed overlying the annular ceramic member;
2. Provide material to be processed and solvent in a capsule;
3. Place the capsule within an interior region of the capsule region;
4. Place annular plugs, end caps, end flanges onto ends of the apparatus;
5. Attach end flanges using at least one fastener;
6. Provide electrical energy to heating member to cause an increase in temperature within the capsule to greater than 200 Degrees Celsius to cause the solvent to be superheated;
7. Form a crystalline material from a process of the superheated solvent;
8. Remove thermal energy from the capsule to cause a temperature of the capsule to change from a first temperature to a second temperature, which is lower than the first temperature;
9. Remove a first flange and a second flange from the high pressure apparatus;
10. Move a mechanical member, using a hydraulic drive force, from the first region of the capsule region toward the second region to transfer the capsule out of the capsule region;
11. Open the capsule;
12. Remove the crystalline material; and
13. Perform other steps, as desired.

The above sequence of steps provides a method according to an embodiment of the present invention. In a specific embodiment, the present invention provides a method and resulting crystalline material provided by a high pressure apparatus having structured support members. Other alternatives can also be provided where steps are added, one or more steps are removed, or one or more steps are provided in a different sequence without departing from the scope of the claims herein. Details of the present method and structure can be found throughout the present specification and more particularly below.

Figure 6:
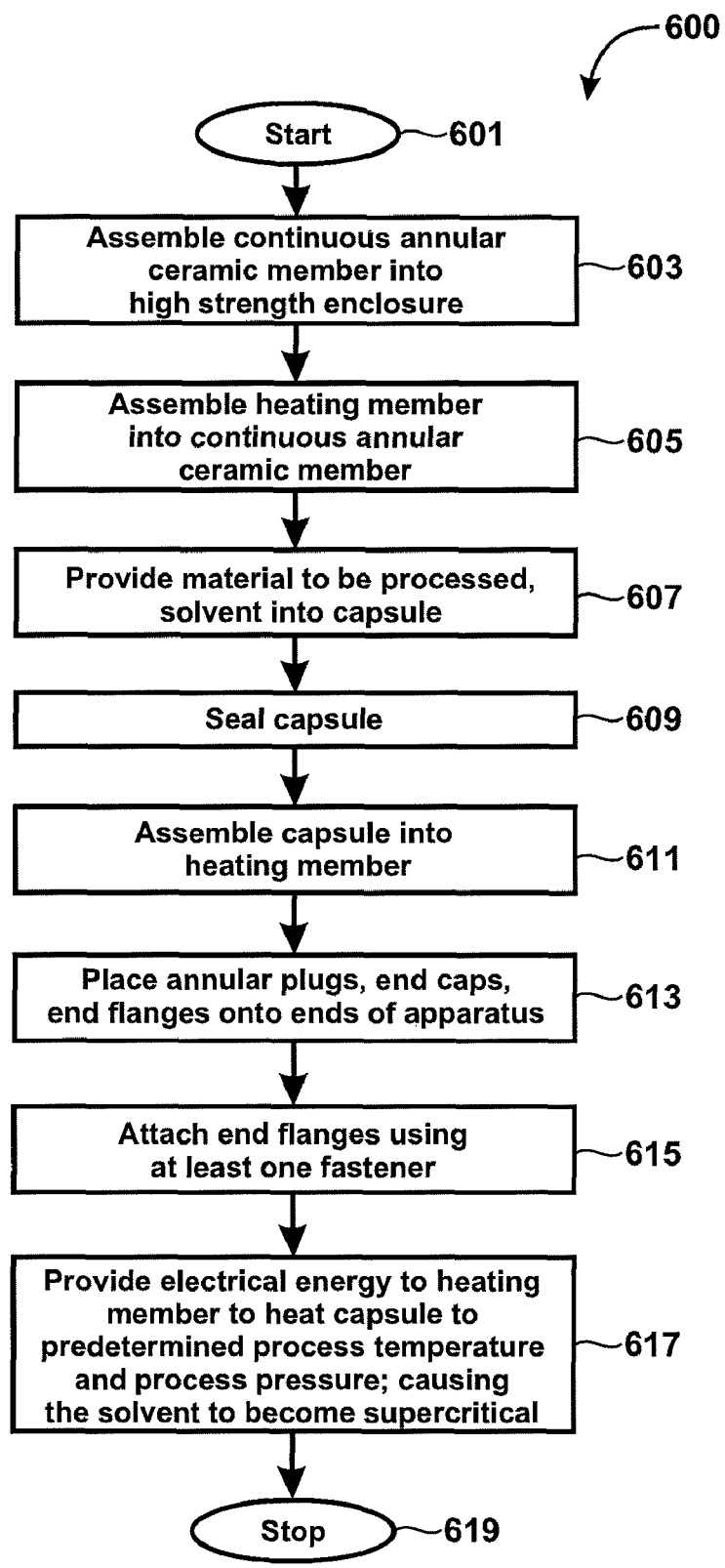
FIG. 6 is a simplified flow diagram of an alternative method of processing a material within a supercritical fluid according to an alternative embodiment of the present invention.

FIG. 6 is a simplified flow diagram 600 of an alternative method of processing a material within a supercritical fluid according to an alternative embodiment of the present invention. This diagram is merely an example, which should not unduly limit the scope of the claims herein. One of ordinary skill in the art would recognize other variations, modifications, and alternatives. In a specific embodiment, the method beings with start, step 601. The method begins by assembling (step 603) an apparatus for high pressure crystal or material processing, such as the one described above, but can be others. In a specific embodiment, the apparatus has a capsule region (for example, cylindrical in shape) comprising a first region and a second region, and a length defined between the first region and the second region. The apparatus also has an annular heating member enclosing the capsule region and at least one continuous ceramic or annular metal or cermet member having a predetermined thickness disposed continuously around a perimeter of the annular heating member, which are assembled together, step 605. In a specific embodiment, the capsule, heating member, and annular member are inserted into a high strength enclosure material disposed overlying the annular ceramic member. Of course, there can be other variations, modifications, and alternatives.

In a specific embodiment, the method provides a capsule containing a solvent, such as ammonia, for example, which includes a material to be processed, step 607. In a preferred embodiment, the capsule is sealed, step 609. In a specific embodiment, each of the capsule ends are welded and/or brazed to form a sealed capsule structure. In a specific embodiment, the method assembles by placing (step 611) the capsule containing the solvent and starting crystal within an interior region of the capsule region. In a preferred embodiment, the method places annular plugs, end caps, and end flanges on to each of the ends of the apparatus, step 613. See, for example, FIG. 2. In a preferred embodiment, each of the end flanges is secured by way of a fastener or a plurality of fasteners. Of course, there can be other variations, modifications, and alternatives.

In a specific embodiment, the method provides electrical energy (step 617) in the form of power to the heating member. The heating member provides thermal energy to the capsule to a predetermined process temperature and pressure, which cause the solvent to be in a supercritical state according to a specific embodiment. The method processes the capsule with thermal energy to cause an increase in temperature within the capsule to greater than 200 Degrees Celsius to cause the solvent to be superheated. Of course, there can be other variations, modifications, and alternatives.

In a specific embodiment, the method forms a crystalline material from a process of the superheated solvent. In a preferred embodiment, the crystalline material is gallium containing crystal such as GaN, AlGaN, InGaN, and others. In a specific embodiment, the method removes thermal energy from the capsule to cause a temperature of the capsule to change from a first temperature to a second temperature, which is lower than the first temperature. Once the energy has been removed and temperature reduced to a suitable level, the method removes one or more flanges, which mechanically held at least the capsule in place. In a preferred embodiment, the method uses a mechanical member, such as a plunger, to hydraulically move the mechanical member from the first region of the capsule region toward the second region to transfer the capsule out of the capsule region free from the apparatus.

In a specific embodiment, the capsule is now free from the apparatus. In a specific embodiment, the capsule is opened. In a preferred embodiment, the crystalline material is removed from an interior region of the capsule. Depending upon the embodiment, there can also be other steps, which can be inserted or added or certain steps can also be removed. In a specific embodiment, the method ends at stop, step 619. Of course, there can be other variations, modifications, and alternatives.

The above sequence of steps provides a method according to an embodiment of the present invention. In a specific embodiment, the present invention provides a method and resulting crystalline material provided by a high pressure apparatus having structured support members. Other alternatives can also be provided where steps are added, one or more steps are removed, or one or more steps are provided in a different sequence without departing from the scope of the claims herein.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. Apparatus for high pressure material processing comprising:
   a cylindrical capsule opening for retaining a capsule having a length;
   a metal capsule containing ammonia and a mineralizer disposed within the capsule opening;
   an annular heating member surrounding at least a portion of the length of the capsule opening;
   at least one annular ceramic member disposed continuously around a perimeter of the annular heating member, the annular ceramic member being made of a material having a compressive strength of at least about 0.5 GPa and a thermal conductivity of less than about 100 watts per meter-Kelvin, the at least one annular ceramic member containing at least one crack; and
   a high strength enclosure surrounding the at least one annular ceramic member.

2. Apparatus as in claim 1 wherein the crack penetrates the annular ceramic member and extends to a surface thereof.

3. Apparatus as in claim 1 wherein the capsule comprises at least one material selected from gold, platinum, silver, palladium, rhodium, titanium, rhenium, copper, stainless steel, zirconium, and tantalum.

4. Apparatus as in claim 1 further comprising a cylindrical sleeve disposed between the at least one annular ceramic member and the high strength enclosure.

5. Apparatus as in claim 4 wherein the cylindrical sleeve comprises at least one material selected from stainless steel, iron, steel, iron alloy, nickel, and nickel alloy.

6. Apparatus as in claim 5 wherein an outer diameter of the cylindrical sleeve is tapered from one end to an opposite end with a taper angle between about 0.1 and about 5 degrees.

7. Apparatus as in claim 1 wherein the high strength enclosure has a length and an inner diameter to define an aspect ratio between about 2 to about 25, the inner diameter is between about two inches and about fifty inches, the length is between 6 inches and 500 inches, and the ratio between the outer diameter and the inner diameter is between 1.2 and 5.

8. Apparatus as in claim 7 wherein the at least one annular member has an inner diameter between 1.5 inches and 8 inches, a height between 1.5 inches and 8 inches, and a ratio between the outer diameter and the inner diameter between 1.5 and 3.

9. Apparatus for high pressure crystal processing comprising:
   a cylindrical capsule region having a length;
   a metal capsule containing ammonia and a mineralizer disposed within the cylindrical capsule region.
   an annular heating member enclosing at least a portion of the length of capsule region;
   at least two annular ceramic radial segments arranged sequentially and disposed continuously around a perimeter of the annular heating member, the annular ceramic radial segments being made of a material having a compressive strength of at least about 0.5 GPa and a thermal conductivity of less than about 100 watts per meter-Kelvin, at least one of the annular ceramic radial segments containing at least one crack; and an pressure resistant enclosure surrounding the annular radial segments.

10. Apparatus as in claim 9 wherein the crack penetrates the annular ceramic radial segment and extends to a surface thereof.

11. Apparatus as in claim 9 further comprising a cylindrical sleeve overlying the at least two annular ceramic radial segments.

12. Apparatus as in claim 11 wherein the cylindrical sleeve comprises at least one material selected from stainless steel, iron, steel, iron alloy, nickel, and nickel alloy.

13. Apparatus as in claim 11 wherein an outer diameter of the cylindrical sleeve is tapered from one end to an opposite end with a taper angle between about 0.1 and about 5 degrees.

* * * * *